United States Patent
Tan et al.

(10) Patent No.: US 12,032,258 B2
(45) Date of Patent: Jul. 9, 2024

(54) ARRAY SUBSTRATE, MANUFACTURING METHOD THEREOF, AND DISPLAY PANEL

(71) Applicant: TCL CHINA STAR OPTOELECTRONICS TECHNOLOGY CO., LTD., Guangdong (CN)

(72) Inventors: Xiaofang Tan, Guangdong (CN); Zhiwei Song, Guangdong (CN); Wei He, Guangdong (CN); Jiwang Yuan, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/594,035

(22) PCT Filed: Jul. 29, 2021

(86) PCT No.: PCT/CN2021/109177
§ 371 (c)(1),
(2) Date: Sep. 30, 2021

(87) PCT Pub. No.: WO2023/000368
PCT Pub. Date: Jan. 26, 2023

(65) Prior Publication Data
US 2024/0045291 A1    Feb. 8, 2024

(30) Foreign Application Priority Data
Jul. 22, 2021   (CN) .................. 202110832924.8

(51) Int. Cl.
G02F 1/1343    (2006.01)
G02F 1/1362    (2006.01)
G02F 1/1368    (2006.01)
H01L 27/12     (2006.01)

(52) U.S. Cl.
CPC .. *G02F 1/136295* (2021.01); *G02F 1/134318* (2021.01); *G02F 1/1368* (2013.01);
(Continued)

(58) Field of Classification Search
CPC ............ G02F 1/1333; G02F 1/133345; G02F 1/1343; G02F 1/134309; G02F 1/134318;
(Continued)

(56) References Cited

U.S. PATENT DOCUMENTS

2008/0024688 A1    1/2008  Mizoguchi
2008/0123044 A1*   5/2008  Oh .................... G02F 1/136227
                                                    349/187
(Continued)

FOREIGN PATENT DOCUMENTS

CN    101093843 A    12/2007
CN    101303500 A    11/2008
(Continued)

OTHER PUBLICATIONS

International Search Report in International application No. PCT/CN2021/109177, dated Apr. 20, 2022.
(Continued)

*Primary Examiner* — Thoi V Duong

(57) ABSTRACT

An array substrate, a manufacturing method thereof, and a display panel are provided. In the array substrate, a first metal layer includes a common electrode, the common electrode includes a first frame and a wire disposed in the first frame, the wire and the first frame are insulated from each other and spaced apart, a second metal layer and the first metal layer are disposed in different layers, the second metal layer includes a share electrode, and the share electrode is disposed overlapping the wire.

20 Claims, 6 Drawing Sheets

(52) U.S. Cl.
CPC ...... *H01L 27/1244* (2013.01); *H01L 27/1288* (2013.01); *G02F 1/134309* (2013.01); *G02F 1/13624* (2013.01); *G02F 1/136286* (2013.01)

(58) Field of Classification Search
CPC ............. G02F 1/134345; G02F 1/1362; G02F 1/136227; G02F 1/13624; G02F 1/136286; G02F 1/13629; G02F 1/136295; G02F 1/1368; H01L 27/124; H01L 27/1244; H01L 27/1259; H01L 27/1288
See application file for complete search history.

(56) References Cited

U.S. PATENT DOCUMENTS

2016/0370675 A1 12/2016 Ren
2017/0315411 A1 11/2017 Shin

FOREIGN PATENT DOCUMENTS

| | | |
|---|---|---|
| CN | 104898333 A | 9/2015 |
| CN | 111198463 A | 5/2020 |
| JP | 2002131780 A | 5/2002 |
| KR | 20040038251 A | 5/2004 |
| KR | 20060001670 A | 1/2006 |
| KR | 20080002152 A | 1/2008 |

OTHER PUBLICATIONS

Written Opinion of the International Search Authority in International application No. PCT/CN2021/109177, dated Apr. 20, 2022.
Korean Office Action issued in corresponding Korean Patent Application No. 10-2021-7026677 dated Sep. 20, 2022, pp. 1-5.
Japanese Office Action issued in corresponding Japanese Patent Application No. 2021-548262 dated Sep. 5, 2023, pp. 1-2.

* cited by examiner

B11 — Forming a first metal layer on a substrate, wherein the first metal layer comprises a common electrode and a scan line, the common electrode and the scan line are spaced apart, the common electrode comprises a first frame and a wire disposed in the first frame, and the wire and the first frame are insulated from each other and spaced apart.

B12 — Forming a first insulation layer on the first metal layer.

B13 — Forming a second metal layer on the first insulation layer, wherein the second metal layer comprises a data line and a share electrode, the data line and the share electrode are spaced apart, the scan line and the data line are disposed crossing each other to form a pixel area, and the share electrode is disposed overlapping the wire.

B14 — Forming a second insulation layer on the second metal layer.

B15 — Forming a pixel electrode layer on the second insulation layer, wherein the pixel electrode layer comprises a pixel electrode, and the pixel electrode is correspondingly disposed in the pixel area.

FIG. 7

ARRAY SUBSTRATE, MANUFACTURING METHOD THEREOF, AND DISPLAY PANEL

FIELD OF INVENTION

The present application relates to the technical field of display, and specifically to an array substrate, a manufacturing method thereof, and a display panel.

BACKGROUND OF INVENTION

Currently, in order to improve light transmittance of a liquid crystal display panel, an eight-domain pixel electrode and a share bar are adopted in an array substrate to drive liquid crystals to deflect. Pixels of the array substrate include a main pixel area and a sub-pixel area. A thin film transistor (TFT) and a main pixel electrode are configured in the main pixel area, and two TFTs and a sub-pixel electrode are configured in the sub-pixel area, wherein one of the TFTs is connected to the share bar.

However, in researches and implementations of conventional technology, the inventor of the present application has found that because a common electrode includes a frame and a strip connected in the frame, and the strip overlaps a share bar by a large overlapped area, a short circuit easily occurs between the common electrode and the share bar and leads to vertical dark lines.

SUMMARY OF INVENTION

Embodiments of the present application provide an array substrate, a manufacturing method thereof, and a display panel to decrease a risk of a short circuit occurred between a common electrode and a share bar.

Embodiments of the present application provide an array substrate that includes:

A substrate;

A first metal layer disposed on the substrate, wherein the first metal layer includes a common electrode and a scan line, the common electrode and the scan line are spaced apart, the common electrode includes a first frame and a wire disposed in the first frame, and the wire and the first frame are insulated from each other and spaced apart;

A first insulation layer disposed on the first metal layer;

A second metal layer disposed on the first insulation layer, wherein the second metal layer includes a data line and a share electrode, the data line and the share electrode are spaced apart, the scan line and the data line are disposed crossing each other to form a pixel area, and the share electrode is disposed overlapping the wire;

A second insulation layer disposed on the second metal layer; and

A pixel electrode layer disposed on the second insulation layer, wherein the pixel electrode layer includes a pixel electrode, and the pixel electrode is correspondingly disposed in the pixel area.

Optionally, in some embodiments of the present application, the array substrate further includes an active layer disposed on the first insulation layer, wherein the second metal layer is disposed on the active layer, the active layer includes a first part, and the first part overlaps the wire;

Wherein an orthographic projection of the first part on a plane at which the substrate locates is located in an orthographic projection of the wire on the plane at which the substrate locates.

Optionally, in some embodiments of the present application, in a direction from an end surface of the wire to a middle area of the wire, the wire has an equal width.

Optionally, in some embodiments of the present application, a vertical distance between an end surface of the wire and the first frame ranges from 4 micrometers to 8 micrometers.

Optionally, in some embodiments of the present application, a pattern of the wire includes two short sides disposed opposite to each other and two long sides disposed opposite to each other, one long side is connected to one end of each of the short sides, another long side is connected to another end of each of the short sides, an extending direction of the short sides is parallel to an extending direction of the scan line, and an extending direction of the long sides is perpendicular to the extending direction of the short sides.

Optionally, in some embodiments of the present application, a vertical distance between the short sides and the first frame ranges from 4 micrometers to 8 micrometers.

Optionally, in some embodiments of the present application, the share electrode includes a main wire part, the pixel electrode includes a main pixel electrode, the main pixel electrode includes a second frame and a first stem part connected in the second frame, the main wire part, the wire, and the first stem part have a same extending direction, and the main wire part, the wire, and the first stem part are disposed overlapping each other.

Optionally, in some embodiments of the present application, a width of the wire is greater than a width of the main wire part.

Optionally, in some embodiments of the present application, the pixel electrode includes a sub-pixel electrode, the array substrate includes a first thin film transistor, a second thin film transistor, and a third thin film transistor, and the first thin film transistor, the second thin film transistor, and the third thin film transistor are correspondingly disposed between two adjacent pixel areas;

Wherein gates of the first thin film transistor, the second thin film transistor, and the third thin film transistor are all connected to a same corresponding scan line, sources of the first thin film transistor and the second thin film transistor are connected to a same corresponding data line, a source of the third thin film transistor is connected to a drain of the second thin film transistor, a drain of the first thin film transistor is connected to the main pixel electrode, the drain of the second thin film transistor is connected to the sub-pixel electrode, and a drain of the third thin film transistor is connected to the share electrode.

Optionally, in some embodiments of the present application, the share electrode includes a bending part connected between two adjacent main wire parts, the bending part is correspondingly disposed at a lateral area of the first thin film transistor, the second thin film transistor, and the third thin film transistor;

Wherein a part of the bending part is disposed overlapping the first frame.

Embodiments of the present application further relates to a manufacturing method of an array substrate including following steps:

Forming a first metal layer on a substrate, wherein the first metal layer includes a common electrode and a scan line, the common electrode and the scan line are spaced apart, the common electrode includes a first frame and a wire disposed in the first frame, and the wire and the first frame are insulated from each other and spaced apart;

Forming a first insulation layer on the first metal layer;

Forming a second metal layer on the first insulation layer, wherein the second metal layer includes a data line and a share electrode, the data line and the share electrode are spaced apart, the scan line and the data line are disposed crossing each other to form a pixel area, and the share electrode is disposed overlapping the wire;

Forming a second insulation layer on the second metal layer; and

Forming a pixel electrode layer on the second insulation layer, wherein the pixel electrode layer includes a pixel electrode, and the pixel electrode is correspondingly disposed in the pixel area.

Optionally, in some embodiments of the present application, a mask is used to form the first metal layer;

Wherein the mask includes a first pattern and a second pattern, the second pattern is disposed inside of the first pattern and spaced apart from the first pattern, the first pattern is configured to form the first frame, and the second pattern is configured to form the wire;

Wherein the second pattern includes a first opening and a second opening, and the second opening is communicatively connected to four corners of the first opening; and Wherein the first opening is rectangular, the first opening corresponds to an area of the wire, and the second opening corresponds to a lateral area of four corners of the wire.

Optionally, in some embodiments of the present application, the mask includes a third pattern disposed outside of the first pattern, and the third pattern is configured to form the scan line;

Wherein the first opening includes two first sides disposed opposite to each other and two second sides disposed opposite to each other, one first side is connected to one end of each of the second sides, another first side is connected to another end of each of the second sides, an extending direction of the second sides is parallel to an extending direction of the third pattern, and an extending direction of the first sides is perpendicular to the extending direction of the second sides; and Wherein a part of the second opening protrudes from the first sides, and a part of the second opening protrudes from the second sides, such that in a direction from an end surface of the wire to a middle area of the wire, the wire has an equal width.

The present application further relates to a display panel that includes a color filter substrate and the array substrate according to the above-described embodiments:

The array substrate includes:

A substrate;

A first metal layer disposed on the substrate, wherein the first metal layer includes a common electrode and a scan line, the common electrode and the scan line are spaced apart, the common electrode includes a first frame and a wire disposed in the first frame, and the wire and the first frame are insulated from each other and spaced apart;

A first insulation layer disposed on the first metal layer;

A second metal layer disposed on the first insulation layer, wherein the second metal layer includes a data line and a share electrode, the data line and the share electrode are spaced apart, the scan line and the data line are disposed crossing each other to form a pixel area, and the share electrode is disposed overlapping the wire;

A second insulation layer disposed on the second metal layer; and

A pixel electrode layer disposed on the second insulation layer, wherein the pixel electrode layer includes a pixel electrode, and the pixel electrode is correspondingly disposed in the pixel area.

Optionally, in some embodiments of the present application, the array substrate further includes an active layer disposed on the first insulation layer, wherein the second metal layer is disposed on the active layer, the active layer includes a first part, and the first part overlaps the wire;

Wherein an orthographic projection of the first part on a plane at which the substrate locates is located in an orthographic projection of the wire on the plane at which the substrate locates.

Optionally, in some embodiments of the present application, in a direction from an end surface of the wire to a middle area of the wire, the wire has an equal width.

Optionally, in some embodiments of the present application, a vertical distance between an end surface of the wire and the first frame ranges from 4 micrometers to 8 micrometers.

Optionally, in some embodiments of the present application, a pattern of the wire includes two short sides disposed opposite to each other and two long sides disposed opposite to each other, one long side is connected to one end of each of the short sides, another long side is connected to another end of each of the short sides, an extending direction of the short sides is parallel to an extending direction of the scan line, and an extending direction of the long sides is perpendicular to the extending direction of the short sides.

Optionally, in some embodiments of the present application, a vertical distance between the short sides and the first frame ranges from 4 micrometers to 8 micrometers.

Optionally, in some embodiments of the present application, the share electrode includes a main wire part, the pixel electrode includes a main pixel electrode, the main pixel electrode includes a second frame and a first stem part connected in the second frame, the main wire part, the wire, and the first stem part have a same extending direction, and the main wire part, the wire, and the first stem part are disposed overlapping each other.

Optionally, in some embodiments of the present application, a width of the wire is greater than a width of the main wire part.

Optionally, in some embodiments of the present application, the pixel electrode includes a sub-pixel electrode, the array substrate includes a first thin film transistor, a second thin film transistor, and a third thin film transistor, and the first thin film transistor, the second thin film transistor, and the third thin film transistor are correspondingly disposed between two adjacent pixel areas;

Wherein gates of the first thin film transistor, the second thin film transistor, and the third thin film transistor are all connected to a same corresponding scan line, sources of the first thin film transistor and the second thin film transistor are connected to a same corresponding data line, a source of the third thin film transistor is connected to a drain of the second thin film transistor, a drain of the first thin film transistor is connected to the main pixel electrode, the drain of the second thin film transistor is connected to the sub-pixel electrode, and a drain of the third thin film transistor is connected to the share electrode.

Optionally, in some embodiments of the present application, the share electrode includes a bending part connected between two adjacent main wire parts, the bending part is correspondingly disposed at a lateral area of the first thin film transistor, the second thin film transistor, and the third thin film transistor;

Wherein a part of the bending part is disposed overlapping the first frame.

In the array substrate according to embodiments of the present application, a first metal layer includes a common electrode and a scan line, and the common electrode and the scan line are spaced apart. The common electrode includes a first frame and a wire disposed in the first frame. The wire and the first frame are insulated from each other and spaced apart. A second metal layer and the first metal layer are disposed in different layers. The second metal layer includes a data line and a share electrode, and the data line and the share electrode are spaced apart. The share electrode is disposed overlapping the wire. When the share electrode is disposed overlapping the wire, because the wire is spaced apart from the first frame, in comparison with a common electrode in conventional technology, the wire is disconnected from the first frame, decreasing a risk of a short circuit between the share electrode and the common electrode.

DESCRIPTION OF DRAWINGS

The accompanying figures to be used in the description of embodiments of the present application will be described in brief to more clearly illustrate the technical solutions of the embodiments. The accompanying figures described below are only part of the embodiments of the present application, from which figures those skilled in the art can derive further figures without making any inventive efforts.

FIG. 7 is a flowchart of a manufacturing method of an array substrate according to an embodiment of the present application.

DETAILED DESCRIPTION OF PREFERRED EMBODIMENTS

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

Embodiments of the present application provide an array substrate, a manufacturing method thereof, and a display panel, and they will be described in detail as follows. It should be understood that an order of following embodiments does not limit priority of the embodiments.

Figure 1:
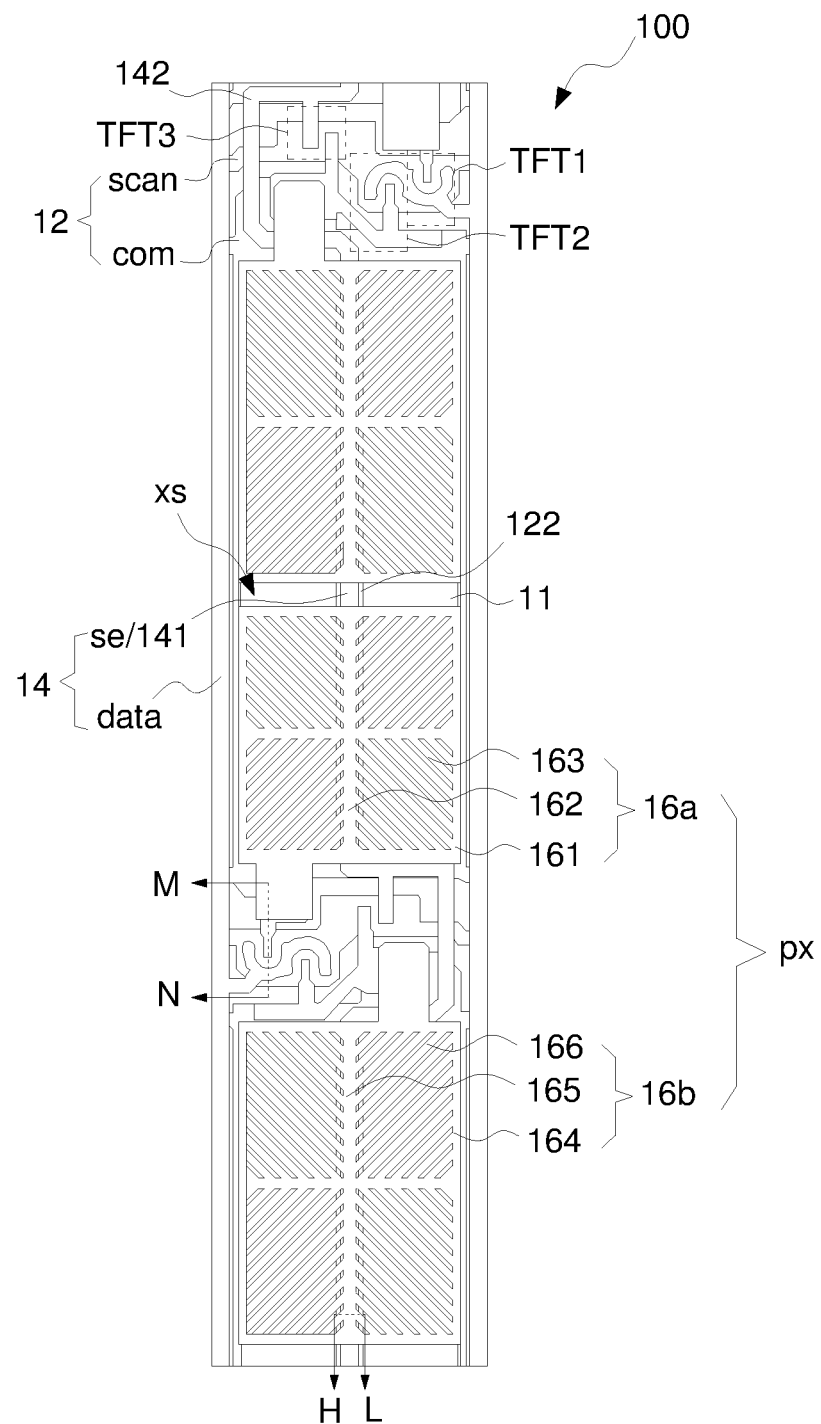
FIG. 1 is a planar structural schematic diagram of an array substrate according to an embodiment of the present application.
Figure 2:
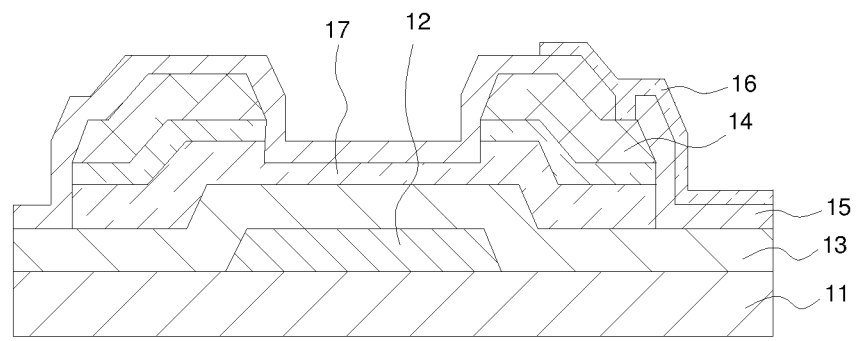
FIG. 2 is a sectional view of FIG. 1 along line MN.

Referring to FIG. 1 and FIG. 2, embodiments of the present application provide an array substrate 100 that includes a substrate 11, a first metal layer 12, a first insulation layer 13, a second metal layer 14, a second insulation layer 15, and a pixel electrode layer 16.

Figure 3:
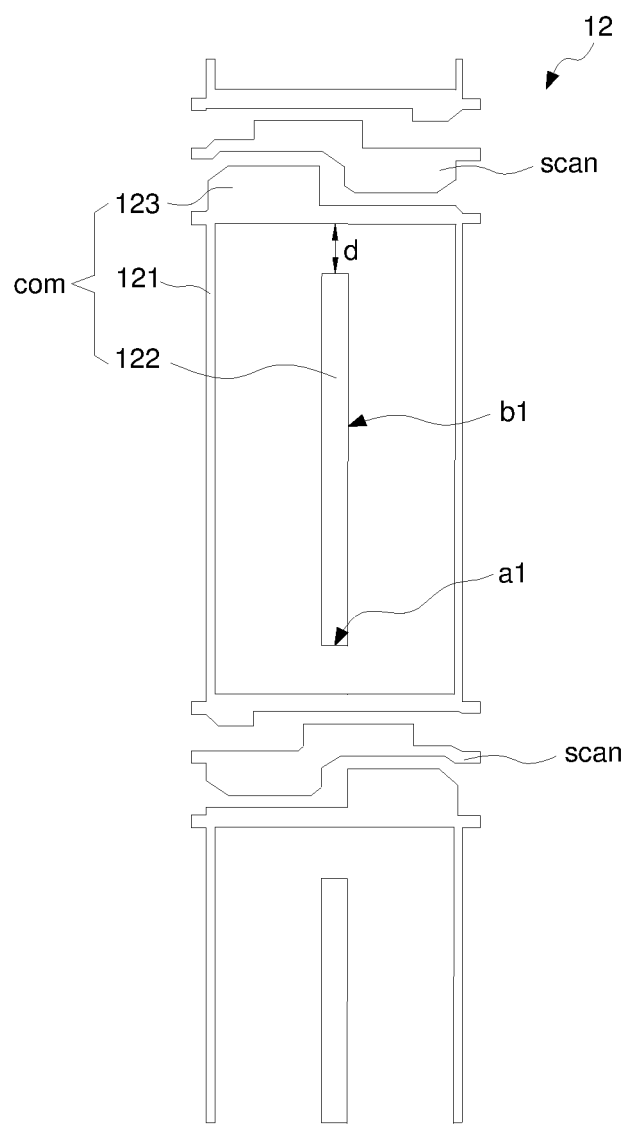
FIG. 3 is a planar structural schematic diagram of a first metal layer in the array substrate according to an embodiment of the present application.

Referring to FIG. 3, the first metal layer 12 is disposed on the substrate 11. The first metal layer 12 includes a common electrode com and a scan line scan, and the common electrode com and the scan line scan are spaced apart. The common electrode com includes a first frame 121 and a wire 122 disposed in the first frame 121. The wire 122 and the first frame 121 are insulated from each other and spaced apart.

The first insulation layer 13 is disposed on the first metal layer 12.

The second metal layer 14 is disposed on the first insulation layer 13. The second metal layer 14 includes a data line data and a share electrode se, and the data line data and the share electrode se are spaced apart. The scan line scan and the data line data are disposed crossing each other to form a pixel area xs. The share electrode se is disposed overlapping the wire 122.

The second insulation layer 15 is disposed on the second metal layer 14.

The pixel electrode layer 16 is disposed on the second insulation layer 15. The pixel electrode layer 16 includes a pixel electrode px, and the pixel electrode px is correspondingly disposed in the pixel area xs.

In the array substrate 100 according to embodiments of the present application, under a condition that the share electrode se is disposed overlapping the wire 122 of the common electrode com, the wire 122 and the first frame 121 are spaced apart, that is, the wire 122 is disconnected from the first frame 121. Even if there is a short circuit between the share electrode se and the wire 122, current in the wire 122 would not be led to the first frame 121, decreasing a risk of a short circuit between the share electrode se and the common electrode com.

It should be explained that although the common electrode com according to the present embodiment includes the wire 122, the wire 122 is not electrically connected to other parts of the common electrode com, and therefore the present embodiment decreases a risk of a short circuit between the share electrode se and the common electrode com by decreasing a risk of a short circuit between the share electrode se and the other parts of the common electrode com other than the wire 122.

Optionally, the substrate 11 can be a rigid substrate or a flexible substrate. A material of the substrate 11 includes one of glass, sapphire, silicon, silicon dioxide, polyethylene, polypropylene, polystyrene, polylactide, polyethylene glycol terephthalate, polyimide, or polyurethane.

Optionally, the first metal layer 12 can be materials such as gold, silver, tungsten, molybdenum, iron, aluminum, titanium, silicon-aluminum, aluminum titanium alloys, etc.

Optionally, the second metal layer 14 can also be materials such as gold, silver, tungsten, molybdenum, iron, aluminum, titanium, silicon-aluminum, aluminum titanium alloys, etc.

Optionally, a material of the pixel electrode layer 16 can be oxides such as indium tin oxide, indium zinc oxide, etc. It can also be various conductive metals, alloys, compounds, and their mixtures, such as gold, silver, platinum, etc.

Figure 4:
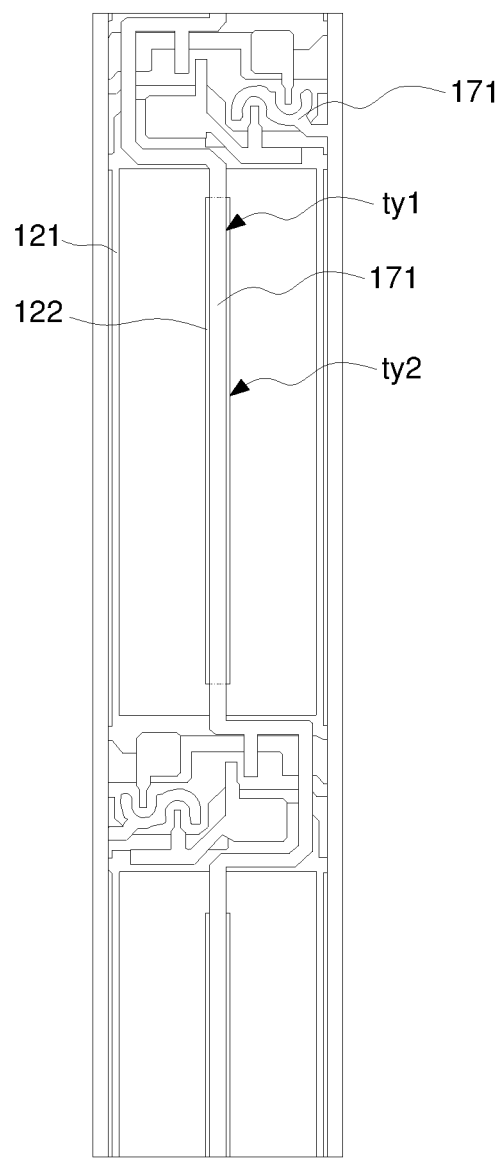
FIG. 4 is a sectional view of FIG. 1 along line HL.
Figure 5:
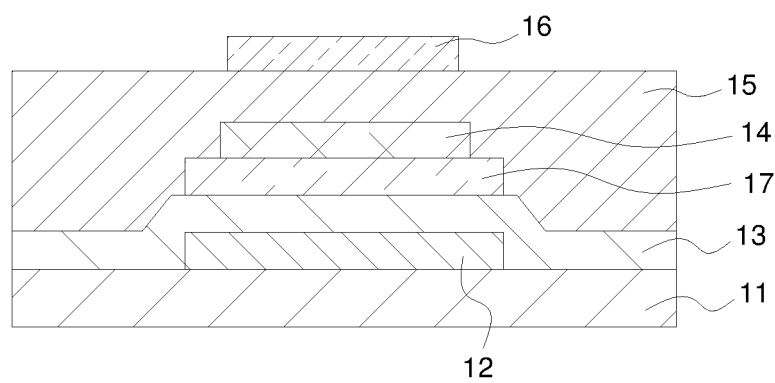
FIG. 5 is a planar structural schematic diagram of staking of a first metal layer and an active layer in the array substrate according to an embodiment of the present application.

Optionally, referring to FIG. 4 and FIG. 5, the array substrate 100 further includes an active layer 17 disposed on the first insulation layer 13. The second metal layer 14 is disposed on the active layer 17. The active layer 17 includes a first part 171, and the first part 171 overlaps the wire 122.

An orthographic projection ty1 of the first part 171 on a plane at which the substrate 11 locates is located in an orthographic projection ty2 of the wire 122 on the plane at which the substrate 11 locates.

Wherein, when a backlight module provides a surface source to a display panel that includes the array substrate 100, light illuminate the first metal layer 12 first, and if the first part 171 of the active layer 17 is not shielded by the wire 122, then the first part 171 would be irradiated and produce photo leakage current. Therefore, the array substrate 100 according to the present embodiment adopts the wire 122 to shield the first part 171 at an area corresponding to the wire, decreasing a risk of photo leakage current produced at an area between the wire 122 and the first frame 121.

Optionally, in a direction from an end surface of the wire 122 to a middle area of the wire 122, the wire 122 has an equal width.

In some embodiments, in the direction from the end surface of the wire 122 to the middle area of the wire 122, the wire 122 can also have unequal widths. It needs only that the wire 122 can shield the active layer 17 at an area corresponding to the wire.

A vertical distance d between the end surface of the wire 122 and the first frame 121 ranges from 4 micrometers to 8 micrometers. For example, the vertical distance d can be 4 micrometers, 5 micrometers, 6 micrometers, 7 micrometers, or 8 micrometers. Wherein, if the vertical distance d is excessively short, then when excessively great current is accumulated in the wire 122, it would puncture the first insulation layer 13 at the interval, causing current of the wire 122 to be led to the first frame 121. If the vertical distance d is excessively long, then a risk of photo leakage current produced at the interval becomes greater. Therefore, by setting the vertical distance d to be between 4 micrometers and 8 micrometers, a risk of a short circuit between the wire 122 and the first frame 121 can be decreased, and a risk of photo leakage current produced at the interval between the wire 122 and the first frame 121 can also be decreased.

Optionally, referring to FIG. 3, a pattern of the wire 122 includes two short sides a1 disposed opposite to each other, and two long sides b1 disposed opposite to each other, one long side b1 is connected to one end of each of the short sides a1, and another long side b1 is connected to another end of each of the short sides a1. An extending direction of the short sides a1 is parallel to an extending direction of the scan line scan. An extending direction of the long sides b1 is perpendicular to the extending direction of the short sides a1.

Specifically, a vertical distance d between the short sides a1 and the first frame 121 ranges from 4 micrometers to 8 micrometers.

Wherein, the common electrode com further includes a protrusion part 123 connected to the first frame 121. The protrusion part 123 is disposed between the first frame 121 and the scan line scan.

Figure 6:
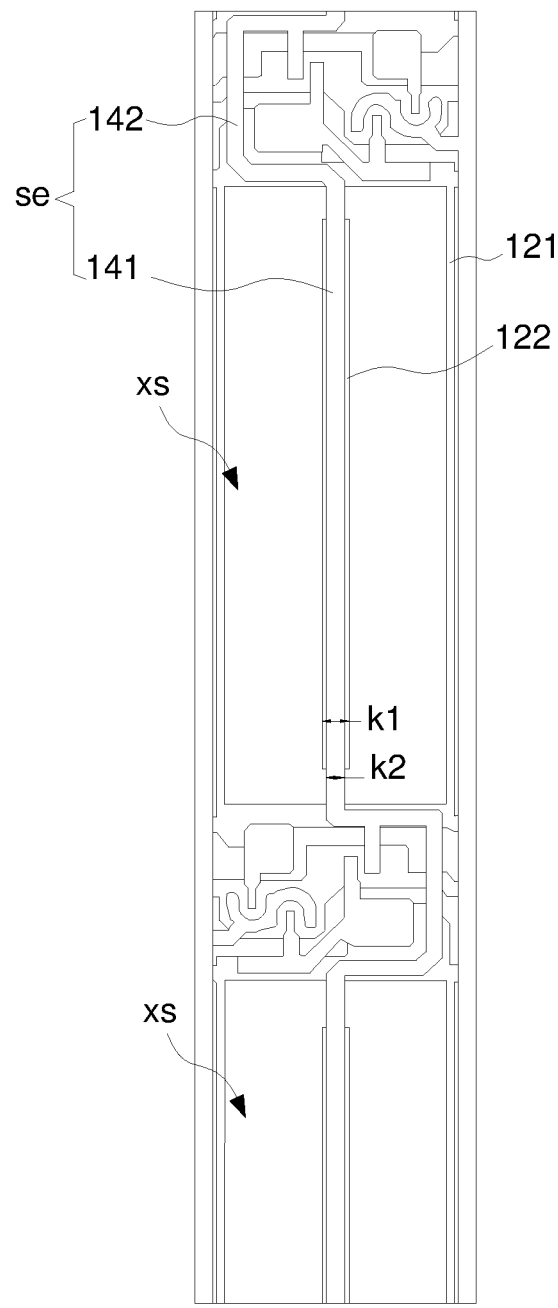
FIG. 6 is a planar structural schematic diagram of staking of a first metal layer and a second metal layer in the array substrate according to an embodiment of the present application.

Optionally, referring to FIG. 1 and FIG. 6, the share electrode se includes a main wire part 141. The pixel electrode px includes a main pixel electrode 16a. The main pixel electrode 16a includes a second frame 161 and a first stem part 162 connected in the second frame 161. The main wire part 141, the wire 122, and the first stem part 162 have a same extending direction. The main wire part 141, the wire 122, and the first stem part 162 are disposed overlapping each other.

In the present embodiment, the main wire part 141, the wire 122, and the first stem part 162 are disposed overlapping each other to increase an aperture ratio.

Optionally, the main pixel electrode 16a further includes a first branch electrode 163, and the first branch electrode 163 is disposed in the second frame 161. An extending direction of the first branch electrode 163 intersects an extending direction of the first stem part 162.

Wherein, multiple first branch electrodes 163 separately extend in four directions to form a four-domain main pixel electrode 16a.

Optionally, the pixel electrode px further includes a sub-pixel electrode 16b. The sub-pixel electrode 16b includes a third frame 164 and a second stem part 165 connected in the third frame 164. The main wire part 141, the wire 122, and the second stem part 165 have a same extending direction. The main wire part 141, the wire 122, and the second stem part 165 are disposed overlapping each other.

In the present embodiment, the main wire part 141, the wire 122, and the second stem part 165 are disposed overlapping each other to further increase an aperture ratio.

Optionally, the sub-pixel electrode 16b further includes a second branch electrode 166, and the second branch electrode 166 is disposed in the third frame 164. An extending direction of the second branch electrode 166 intersects an extending direction of the second stem part 165.

Wherein, multiple second branch electrodes 166 separately extend in four directions to form a four-domain sub-pixel electrode 16b.

Optionally, a width k1 of the wire 122 is greater than a width k2 of the main wire part 141. With this configuration, when a display abnormality occurs due to the share electrode se, an abnormal region can be found according to the wire 122 having a greater line width.

Optionally, the pixel electrode px overlaps the common electrode com to form a capacitor. Specifically, the protrusion part 123 of the common electrode com is disposed overlapping the main pixel electrode 16a to increase capacitance of the capacitor.

Optionally, the array substrate 100 includes a first thin film transistor TFT1, a second thin film transistor TFT2, and a third thin film transistor TFT3. The first thin film transistor TFT1, the second thin film transistor TFT2, and the third thin film transistor TFT3 are correspondingly disposed between two adjacent pixel areas xs.

Gates of the first thin film transistor TFT1, the second thin film transistor TFT2, and the third thin film transistor TFT3 are all connected to a same corresponding scan line scan. Sources of the first thin film transistor TFT1 and the second thin film transistor TFT2 are connected to a same corresponding data line data. A source of the third thin film transistor TFT3 is connected to a drain of the second thin film transistor TFT2. A drain of the first thin film transistor TFT1 is connected to the main pixel electrode 16a. The drain of the second thin film transistor TFT2 is connected to the sub-pixel electrode 16b. A drain of the third thin film transistor TFT3 is connected to the share electrode se.

Wherein, a connecting structure of the first thin film transistor TFT1, the second thin film transistor TFT2, and the third thin film transistor TFT3 to the pixel electrode px realizes a distribution of unequal voltage for the main pixel electrode 16a and the sub-pixel electrode 16b.

Optionally, the source and the drain of the first thin film transistor TFT1, the second thin film transistor TFT2, and the third thin film transistor TFT3 are formed in the second metal layer 14. The gates of the first thin film transistor TFT1, the second thin film transistor TFT2, and the third thin film transistor TFT3 are formed in the first metal layer 12.

Optionally, referring to FIG. 1 and FIG. 6, the share electrode se further includes a bending part 142 connected between two adjacent main wire parts 141. The bending part 142 is correspondingly disposed at a lateral area of the first thin film transistor TFT1, the second thin film transistor TFT2, and the third thin film transistor TFT3.

A part of the bending part 142 is disposed overlapping the first frame 121 to increase an aperture ratio.

Referring to FIG. 7, embodiments of the present application further relates to a manufacturing method of an array substrate including following steps:

Step B11: forming a first metal layer on a substrate, wherein the first metal layer includes a common electrode and a scan line, the common electrode and the scan line are spaced apart, the common electrode includes a first frame and a wire disposed in the first frame, and the wire and the first frame are insulated from each other and spaced apart;

Step B12: forming a first insulation layer on the first metal layer;

Step B13: forming a second metal layer on the first insulation layer, wherein the second metal layer includes a data line and a share electrode, the data line and the share electrode are spaced apart, the scan line and the data line are disposed crossing each other to form a pixel area, and the share electrode is disposed overlapping the wire;

Step B14: forming a second insulation layer on the second metal layer; and

Step B15: forming a pixel electrode layer on the second insulation layer, wherein the pixel electrode layer includes a pixel electrode, and the pixel electrode is correspondingly disposed in the pixel area.

It should be explained that the manufacturing method of the array substrate according to the present embodiment is used to manufacture the array substrate 100 according to the above-described embodiment.

Wherein, in the manufacturing method of the array substrate according to the present embodiment, under a condition that the share electrode is disposed overlapping the wire of the common electrode, the wire and the first frame are spaced apart, that is, the wire is disconnected from the first frame. Even if there is a short circuit between the share electrode and the wire, current in the wire would not be led to the first frame, decreasing a risk of a short circuit between the share electrode and the common electrode.

Referring to FIG. 1-FIG. 6, the manufacturing method of the array substrate according to the present embodiment is explained as follows.

Step B11: forming the first metal layer 12 on the substrate 11.

Optionally, step B11 includes following steps:

Step B111: forming a first metal material layer on the substrate 11.

Step B112: forming a photoresist layer on the first metal material layer;

Step B113: shielding the photoresist layer using a mask 200, and then exposing and developing the photoresist layer to form a patterned photoresist layer.

Figure 8:
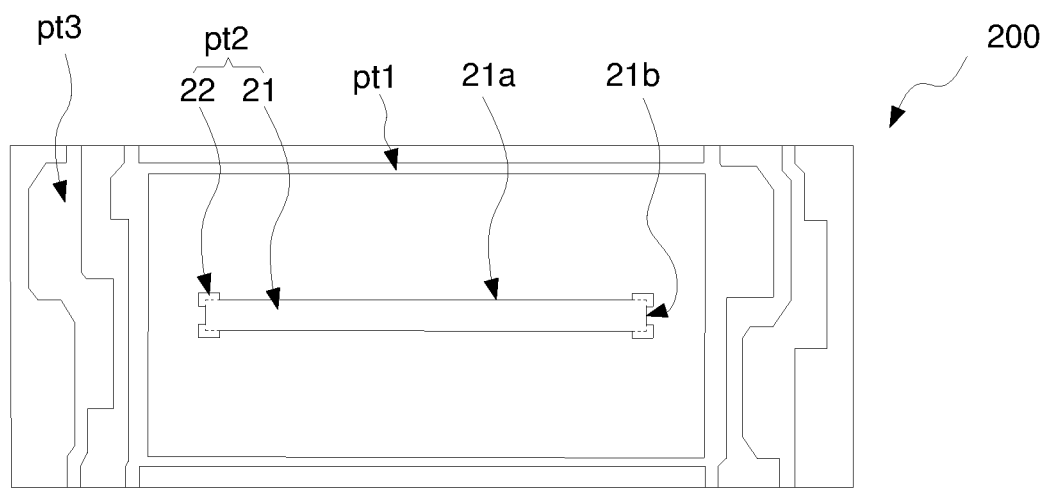
FIG. 8 is a structural schematic diagram of a mask of the manufacturing method of the array substrate according to an embodiment of the present application.

Wherein, referring to FIG. 8, the mask 200 includes a first pattern pt1 and a second pattern pt2. The second pattern pt2 is disposed inside of the first pattern pt1 and spaced apart from the first pattern pt1. The first pattern pt1 is configured to form the first frame 121. The second pattern pt2 is configured to form the wire 122.

The second pattern pt2 includes a first opening 21 and a second opening 22, and the second opening 22 is communicatively connected to four corners of the first opening 21.

The first opening 21 is rectangular, the first opening 21 corresponds to an area of the wire 122, and the second opening 22 corresponds to a lateral area of four corners of the wire 122.

It should be explained that in a manufacturing process of a common electrode according to conventional technology, the first opening is used to directly form the wire. Because of deviation of manufacturing processes, broken corners would appear in the wire in comparison with a preset shape of the wire, and therefore the wire cannot completely shield a corresponding active layer, causing photo leakage current.

Therefore, in order to solve the above-described technical problem, in the manufacturing method according to the present embodiment, the second opening 22 is disposed at a lateral area of four corners of the first opening 21 to increase exposure of the four corners and decrease excessive etching of photoresist corresponding to an area of the wire 122, ensuring completeness of the wire 122.

Optionally, the mask 200 further includes a third pattern pt3, and the third pattern pt3 is disposed outside of the first pattern pt1. The third pattern pt3 is configured to form the scan line scan.

The first opening 21 includes two first sides 21a disposed opposite to each other and two second sides 21b disposed opposite to each other. One first side 21a is connected to one end of each of the second sides 21b, and another first side 21a is connected to another end of each of the second sides 21b. An extending direction of the second sides 21b is parallel to an extending direction of the third pattern pt3. An extending direction of the first sides 21a is perpendicular to the extending direction of the second sides 21b.

A part of the second opening 22 protrudes from the first sides 21a, and a part of the second opening 22 protrudes from the second sides 21b.

Step B114: using the patterned photoresist layer as a shield and etching the first metal material layer to form the first metal layer.

The first metal layer 12 includes the common electrode com and the scan line scan, and the common electrode com and the scan line scan are spaced apart. The common electrode com includes the first frame 121 and the wire 122 disposed in the first frame 121. The wire 122 and the first frame 121 are insulated from each other and spaced apart.

Optionally, a vertical distance d between an end surface of the wire 122 and the first frame 121 ranges from 4 micrometers to 8 micrometers. For example, the vertical distance d can be 4 micrometers, 5 micrometers, 6 micrometers, 7 micrometers, or 8 micrometers. Wherein, if the vertical distance d is excessively short, then when excessively great current is accumulated in the wire 122, it would puncture the first insulation layer 13 at the interval, causing current of the wire 122 to be led to the first frame 121. If the vertical distance d is excessively long, then a risk of photo leakage current produced at the interval becomes greater. Therefore, by setting the vertical distance d to be between 4 micrometers and 8 micrometers, a risk of a short circuit between the wire 122 and the first frame 121 can be decreased, and a risk of photo leakage current produced at the interval between the wire 122 and the first frame 121 can also be decreased.

Step B12: forming the first insulation layer 13 on the first metal layer 12. Step B121 follows step B12.

Step B121: forming an active layer 17 on the first insulation layer 13. Step B13 follows step B121.

Step B13: forming the second metal layer 14 on the first insulation layer 13. Wherein, the second metal layer 14 is also formed on the active layer 17.

The second metal layer 14 includes a data line data and a share electrode se, and the data line data and the share electrode se are spaced apart. The scan line scan and the data line data are disposed crossing each other to form a pixel area xs. The share electrode se is disposed overlapping the wire 122.

Step B14 follows step B13.

Step B14: forming the second insulation layer 15 on the second metal layer 14. Step B15 follows step B14.

Step B15: forming the pixel electrode layer 16 on the second insulation layer 15. The pixel electrode layer 16 includes the pixel electrode px, and the pixel electrode px is correspondingly disposed in the pixel area xs.

The manufacturing method of the array substrate according to the present embodiment is completed as described above.

Figure 9:
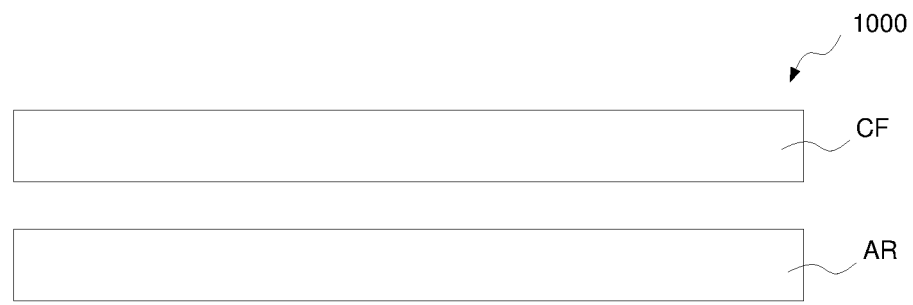
FIG. 9 is a structural schematic diagram of a display panel according to an embodiment of the present application.

Referring to FIG. 9, a display panel 1000 includes a color filter substrate CF and the array substrate AR according to the above-described embodiments.

It should be explained that the display panel 1000 can be an ordinary display panel with a color filter layer disposed in the color filter substrate CF. It can also be a color filter on array (COA) panel with a color filter layer disposed in the array substrate 100.

A structure of the array substrate AR of the display panel 1000 according to the present embodiment is similar or identical to that of the array substrate 100 according to the above-described embodiments, and specific contents can be referred to the array substrate 100 according the above-described embodiments.

In the display panel 1000 according to embodiments of the present application, the first metal layer 12 includes the common electrode com and the scan line scan, and the common electrode com and the scan line scan are spaced apart. The common electrode com includes the first frame 121 and the wire 122 disposed in the first frame 121. The wire 122 and the first frame 121 are insulated from each other and spaced apart. The second metal layer 14 and the first metal layer 12 are disposed in different layers. The second metal layer 14 includes the data line data and the share electrode se, and the data line data and the share electrode se are spaced apart. The share electrode se is disposed overlapping the wire 122. Under a condition that the share electrode se is disposed overlapping the wire 122 of the common electrode com, the wire 122 and the first frame 121 are spaced apart, that is, the wire 122 is disconnected from the first frame 121. Even if there is a short circuit between the share electrode se and the wire 122, current in the wire 122 would not be led to the first frame 121, decreasing a risk of a short circuit between the share electrode se and the common electrode com.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. An array substrate, comprising:
    a substrate;
    a first metal layer disposed on the substrate, wherein the first metal layer comprises a common electrode and a scan line, the common electrode and the scan line are spaced apart, the common electrode comprises a first frame and a wire disposed in the first frame, and the wire and the first frame are insulated from each other and spaced apart;
    a first insulation layer disposed on the first metal layer;
    a second metal layer disposed on the first insulation layer, wherein the second metal layer comprises a data line and a share electrode, the data line and the share electrode are spaced apart, the scan line and the data line are disposed crossing each other to form a pixel area, and the share electrode is disposed overlapping the wire;
    a second insulation layer disposed on the second metal layer; and
    a pixel electrode layer disposed on the second insulation layer, wherein the pixel electrode layer comprises a pixel electrode, and the pixel electrode is correspondingly disposed in the pixel area.

2. The array substrate as claimed in claim 1, comprising an active layer disposed on the first insulation layer, wherein the second metal layer is disposed on the active layer, the active layer comprises a first part, and the first part overlaps the wire;
    wherein an orthographic projection of the first part on a plane at which the substrate locates is located in an orthographic projection of the wire on the plane at which the substrate locates.

3. The array substrate as claimed in claim 2, wherein a pattern of the wire comprises two short sides disposed opposite to each other and two long sides disposed opposite to each other, one long side is connected to one end of each of the short sides, another long side is connected to another end of each of the short sides, an extending direction of the short sides is parallel to an extending direction of the scan line, and an extending direction of the long sides is perpendicular to the extending direction of the short sides.

4. The array substrate as claimed in claim 2, wherein in a direction from an end surface of the wire to a middle area of the wire, the wire has an equal width.

5. The array substrate as claimed in claim 2, wherein a vertical distance between an end surface of the wire and the first frame ranges from 4 micrometers to 8 micrometers.

6. The array substrate as claimed in claim 1, wherein the share electrode comprises a main wire part, the pixel electrode comprises a main pixel electrode, the main pixel electrode comprises a second frame and a first stem part connected in the second frame, the main wire part, the wire, and the first stem part have a same extending direction, and the main wire part, the wire, and the first stem part are disposed overlapping each other.

7. The array substrate as claimed in claim 6, wherein a width of the wire is greater than a width of the main wire part.

8. The array substrate as claimed in claim 6, wherein the pixel electrode comprises a sub-pixel electrode, the array substrate comprises a first thin film transistor, a second thin film transistor, and a third thin film transistor, and the first thin film transistor, the second thin film transistor, and the third thin film transistor are correspondingly disposed between two adjacent pixel areas;
    wherein gates of the first thin film transistor, the second thin film transistor, and the third thin film transistor are all connected to a same corresponding scan line, sources of the first thin film transistor and the second thin film transistor are connected to a same corresponding data line, a source of the third thin film transistor is connected to a drain of the second thin film transistor, a drain of the first thin film transistor is connected to the main pixel electrode, the drain of the second thin film transistor is connected to the sub-pixel electrode, and a drain of the third thin film transistor is connected to the share electrode.

9. The array substrate as claimed in claim 8, wherein the share electrode comprises a bending part connected between two adjacent main wire parts, the bending part is correspondingly disposed at a lateral area of the first thin film transistor, the second thin film transistor, and the third thin film transistor;
    wherein a part of the bending part is disposed overlapping the first frame.

10. A manufacturing method of an array substrate, comprising following steps:
    forming a first metal layer on a substrate, wherein the first metal layer comprises a common electrode and a scan line, the common electrode and the scan line are spaced apart, the common electrode comprises a first frame and a wire disposed in the first frame, and the wire and the first frame are insulated from each other and spaced apart;
    forming a first insulation layer on the first metal layer;
    forming a second metal layer on the first insulation layer, wherein the second metal layer comprises a data line and a share electrode, the data line and the share electrode are spaced apart, the scan line and the data line are disposed crossing each other to form a pixel area, and the share electrode is disposed overlapping the wire;
    forming a second insulation layer on the second metal layer; and
    forming a pixel electrode layer on the second insulation layer, wherein the pixel electrode layer comprises a pixel electrode, and the pixel electrode is correspondingly disposed in the pixel area.

11. The manufacturing method of the array substrate as claimed in claim 10, wherein a mask is used to form the first metal layer;
    wherein the mask comprises a first pattern and a second pattern, the second pattern is disposed inside of the first pattern and spaced apart from the first pattern, the first pattern is configured to form the first frame, and the second pattern is configured to form the wire;
    wherein the second pattern comprises a first opening and a second opening, and the second opening is communicatively connected to four corners of the first opening; and
    wherein the first opening is rectangular, the first opening corresponds to an area of the wire, and the second opening corresponds to a lateral area of four corners of the wire.

12. The manufacturing method of the array substrate as claimed in claim 11, wherein the mask comprises a third pattern disposed outside of the first pattern, and the third pattern is configured to form the scan line;
    wherein the first opening comprises two first sides disposed opposite to each other and two second sides disposed opposite to each other, one first side is connected to one end of each of the second sides, another first side is connected to another end of each of the second sides, an extending direction of the second sides is parallel to an extending direction of the third pattern, and an extending direction of the first sides is perpendicular to the extending direction of the second sides; and
    wherein a part of the second opening protrudes from the first sides, and a part of the second opening protrudes from the second sides.

13. A display panel, comprising a color filter substrate and an array substrate, wherein the array substrate comprises:
    a substrate;
    a first metal layer disposed on the substrate, wherein the first metal layer comprises a common electrode and a scan line, the common electrode and the scan line are spaced apart, the common electrode comprises a first frame and a wire disposed in the first frame, and the wire and the first frame are insulated from each other and spaced apart;
    a first insulation layer disposed on the first metal layer;
    a second metal layer disposed on the first insulation layer, wherein the second metal layer comprises a data line and a share electrode, the data line and the share electrode are spaced apart, the scan line and the data line are disposed crossing each other to form a pixel area, and the share electrode is disposed overlapping the wire;
    a second insulation layer disposed on the second metal layer; and
    a pixel electrode layer disposed on the second insulation layer, wherein the pixel electrode layer comprises a pixel electrode, and the pixel electrode is correspondingly disposed in the pixel area.

14. The display panel as claimed in claim 13, wherein the array substrate comprises an active layer disposed on the first insulation layer, the second metal layer is disposed on the active layer, the active layer comprises a first part, and the first part overlaps the wire;
    wherein an orthographic projection of the first part on a plane at which the substrate locates is located in an orthographic projection of the wire on the plane at which the substrate locates.

15. The display panel as claimed in claim 14, wherein a pattern of the wire comprises two short sides disposed opposite to each other and two long sides disposed opposite to each other, one long side is connected to one end of each of the short sides, another long side is connected to another end of each of the short sides, an extending direction of the short sides is parallel to an extending direction of the scan line, and an extending direction of the long sides is perpendicular to the extending direction of the short sides.

16. The display panel as claimed in claim 14, wherein a vertical distance between an end surface of the wire and the first frame ranges from 4 micrometers to 8 micrometers.

17. The display panel as claimed in claim 13, wherein the share electrode comprises a main wire part, the pixel electrode comprises a main pixel electrode, the main pixel electrode comprises a second frame and a first stem part connected in the second frame, the main wire part, the wire, and the first stem part have a same extending direction, and the main wire part, the wire, and the first stem part are disposed overlapping each other.

18. The display panel as claimed in claim 17, wherein a width of the wire is greater than a width of the main wire part.

19. The display panel as claimed in claim 17, wherein the pixel electrode comprises a sub-pixel electrode, the array substrate comprises a first thin film transistor, a second thin film transistor, and a third thin film transistor, and the first thin film transistor, the second thin film transistor, and the third thin film transistor are correspondingly disposed between two adjacent pixel areas;

wherein gates of the first thin film transistor, the second thin film transistor, and the third thin film transistor are all connected to a same corresponding scan line, sources of the first thin film transistor and the second thin film transistor are connected to a same corresponding data line, a source of the third thin film transistor is connected to a drain of the second thin film transistor, a drain of the first thin film transistor is connected to the main pixel electrode, the drain of the second thin film transistor is connected to the sub-pixel electrode, and a drain of the third thin film transistor is connected to the share electrode.

20. The display panel as claimed in claim 19, wherein the share electrode comprises a bending part connected between two adjacent main wire parts, the bending part is correspondingly disposed at a lateral area of the first thin film transistor, the second thin film transistor, and the third thin film transistor;

wherein a part of the bending part is disposed overlapping the first frame.

\* \* \* \* \*